US008963763B2

(12) United States Patent
Kull

(10) Patent No.: US 8,963,763 B2
(45) Date of Patent: Feb. 24, 2015

(54) CONFIGURING AN ANALOG-DIGITAL CONVERTER

(75) Inventor: Lukas Kull, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 13/490,785

(22) Filed: Jun. 7, 2012

(65) Prior Publication Data

US 2013/0002469 A1  Jan. 3, 2013

Related U.S. Application Data

(63) Continuation of application No. 13/474,787, filed on May 18, 2012, now abandoned.

(30) Foreign Application Priority Data

Jun. 28, 2011 (EP) ..................................... 11171764

(51) Int. Cl.
*H03M 1/12* (2006.01)
*H03M 1/06* (2006.01)
*H03M 1/46* (2006.01)

(52) U.S. Cl.
CPC ............ *H03M 1/0682* (2013.01); *H03M 1/468* (2013.01)
USPC ........... 341/172; 341/118; 341/120; 341/155; 341/161

(58) Field of Classification Search
CPC ... H03M 1/468; H03M 1/804; H03M 1/0682; H03M 1/466; H03M 1/68; H03M 1/12; H03M 1/361; H03M 1/0612; H03M 1/661; H03M 1/76; H03M 1/806; H03M 1/1009; H03M 1/66
USPC ..................... 341/118–122, 155, 172, 161, 72
See application file for complete search history.

(56) References Cited

U.S. PATENT DOCUMENTS

| | | | |
|---|---|---|---|
| 6,707,403 B1 * | 3/2004 | Hurrell | 341/120 |
| 7,015,841 B2 * | 3/2006 | Yoshida et al. | 341/120 |
| 7,038,609 B1 | 5/2006 | Hurrell | |
| 7,233,273 B2 * | 6/2007 | Tachibana et al. | 341/155 |
| 7,271,758 B2 * | 9/2007 | Piasecki et al. | 341/172 |
| 7,501,965 B2 | 3/2009 | Janakiraman | |
| 7,773,024 B2 * | 8/2010 | Ohnhauser et al. | 341/172 |
| 7,893,860 B2 * | 2/2011 | Cho et al. | 341/161 |
| 7,944,379 B2 | 5/2011 | Ohnhaeuser et al. | |
| 7,944,387 B2 * | 5/2011 | Ohnhaeuser et al. | 341/172 |
| 8,223,044 B2 * | 7/2012 | Snedeker | 341/118 |
| 8,633,847 B2 * | 1/2014 | Kull | 341/172 |
| 2004/0075601 A1 * | 4/2004 | Carreau et al. | 341/172 |
| 2007/0139243 A1 * | 6/2007 | Chowdhury et al. | 341/155 |
| 2011/0148675 A1 | 6/2011 | Zhao et al. | |
| 2012/0154194 A1 | 6/2012 | Chang et al. | |
| 2012/0280814 A1 | 11/2012 | Beale et al. | |
| 2012/0326900 A1 * | 12/2012 | Wu et al. | 341/110 |

* cited by examiner

*Primary Examiner* — Linh Nguyen
(74) *Attorney, Agent, or Firm* — Cantor Colburn LLP

(57) ABSTRACT

A method for operating an analog-digital converter including a number of charging units, each comprising a switchable capacitor and an associated reference potential source, includes evaluating a comparison potential in successive decision steps to obtain a comparison result; and successively switching one of the charging units following a previous one of the decision steps, wherein, depending on the obtained comparison result, the comparison potential is changed by the one respective charging unit by connecting the associated reference potential source to the switchable capacitor, wherein in two of the successive switching steps different reference potentials are applied to the switchable capacitor.

9 Claims, 2 Drawing Sheets

US 8,963,763 B2

CONFIGURING AN ANALOG-DIGITAL CONVERTER

PRIORITY

This application is a continuation of U.S. patent application Ser. No. 13/474,787, filed May 18, 2012, now abandoned, which in turn claims priority to European Patent Application No. 11171764.1, filed 28 Jun. 2011, and all the benefits accruing therefrom under 35 U.S.C. §119, the contents of which in its entirety are herein incorporated by reference.

BACKGROUND

The present invention relates generally to analog-digital converters, in particular to successive approximation register (SAR) converters. In particular, the present invention relates to measures for improving the accuracy of an SAR converter.

SAR converters for analog-digital conversion are well known in the art. In particular, SAR converters are frequently used in integrated CMOS devices since they provide a wide range of achievable resolution and conversion time and have competitive power efficiency. Furthermore, SAR converters can be implemented by optimally utilizing the advantages of the CMOS technology, which are small-sized switches and capacitors having well-defined relative capacitances over a broad range.

According to a well-known topology, SAR converters include at least one capacitor bank on a comparison line. The capacitor bank has capacitors of different values, usually having a relation with a factor of $2^n$ (n=integer) between the capacitances. Each capacitor of the capacitor bank is connected between the comparison line and a reference potential line, a ground potential line and an input signal line. Each capacitor is further associated with a switch, so that the respective capacitor can be connected to one of the reference potential line, the ground potential line and the input signal line. The SAR analog-digital converter further has a decision latch for receiving and evaluating the comparison line potential, e.g., with respect to a given ground potential. Furthermore, a logic block assesses the determination results of a previous determination step and accordingly applies a respective potential to a respective capacitor.

In a sampling phase, a voltage level of an input signal (positive voltage level with respect to a ground potential) applied to the input signal line is stored on each capacitor of the capacitor bank while a ground potential is applied to the comparison line. Before starting a conversion phase, the reference potential is applied to each capacitor to present the sampled input voltage and to redistribute charges stored in each of the capacitors to the comparison line. Then, the capacitors are connected with the ground potential line in successive steps, i.e., from the highest capacitance to the lowest capacitance, while it is determined after each step whether the resulting voltage on the input signal line is above or below a predetermined threshold (ground potential). The determination results are stored as result bits in a register. Depending on the determination result, the recently switched capacitor is reset or kept in the set state.

As mentioned above, the capacitors of the capacitor bank usually have a relation with a factor of $2^n$ (n=integer) between the capacitances, so that the factor between the capacitor having the lowest capacitance and the capacitor having the highest capacitance depends on the resolution of the analog-digital converter. Usually, the factor for such a topology equals $2^{B-1}$, wherein B corresponds to the resolution in bits of the analog-digital converter. For a 16-bit analog-digital converter, the factor between the lowest and the highest capacitance is therefore 32,768.

SUMMARY

In one embodiment, a method for operating an analog-digital converter including a number of charging units, each comprising a switchable capacitor and an associated reference potential source, includes evaluating a comparison potential in successive decision steps to obtain a comparison result; and successively switching one of the charging units following a previous one of the decision steps, wherein, depending on the obtained comparison result, the comparison potential is changed by the one respective charging unit by connecting the associated reference potential source to the switchable capacitor, wherein in two of the successive switching steps different reference potentials are applied to the switchable capacitor.

In another embodiment, a method of operating differential analog-digital converter includes configuring a decision unit to evaluate a potential difference between two input signal lines in a decision step; configuring a plurality of charging units for each input signal line each having a switched capacitor unit which is configured to change an input signal line potential on the respective input signal line on application of a reference voltage change; configuring at least one further charging unit at each input signal line to increase an input signal line potential on one input signal line on application of a first voltage change; configuring at least another further charging unit for each input signal line is to decrease an input signal line potential on the respective other input signal line on application of a second voltage change, wherein the sum of the first and the second voltage change equals the reference voltage change.

A control unit is configured to: selectively switch one of the number of charging units at one of the input signal lines depending on a result of evaluating the potential difference between the two input signal lines in a previous decision step; and selectively switch the one further charging unit at one of the input signal lines and the other further charging units at the respective other input signal line depending on a result of evaluating the potential difference between the two input signal lines in a further previous decision step such that the input signal line potential of the one input signal line is increased and the input signal line potential of the other input signal line is reduced; wherein the one further charging unit is configured to increase an input signal line potential on the one input signal line on application of the first voltage change and the other further charging unit is configured to decrease an input signal line potential on the other input signal line on application of the second voltage change in the further decision step.

BRIEF DESCRIPTION OF THE DRAWINGS

Exemplary embodiments are described in more detail in conjunction with the accompanying drawings, in which.

DETAILED DESCRIPTION

Figure 1:
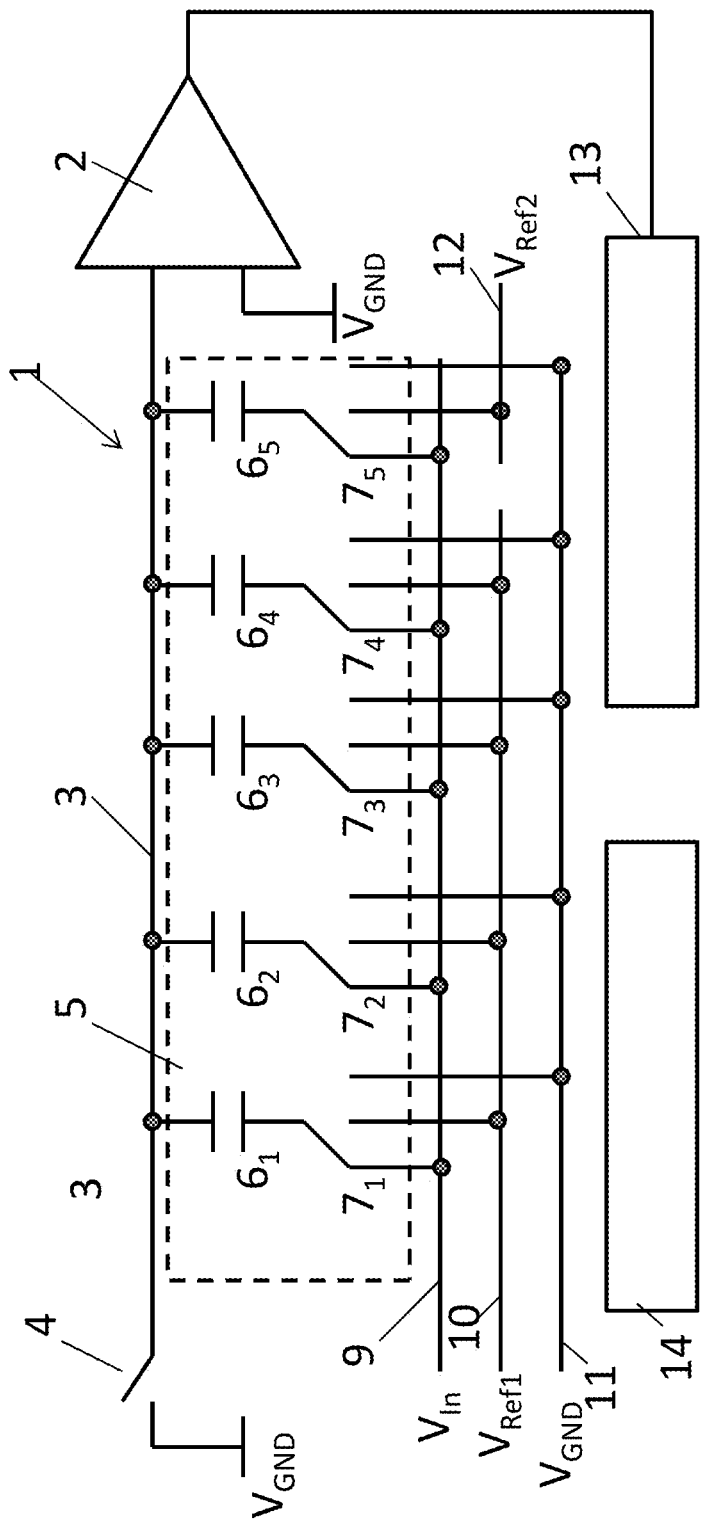
FIG. 1 shows a schematic of an SAR analog-digital converter according to an embodiment.

Although the capacitors described above can be implemented in an integrated circuit with well-defined relative capacitances, the capacitor with the highest capacitance either requires large chip area or the capacitor with the lowest capacitance is so small that its capacitance tolerance is increased, so that it is difficult to precisely maintain the capacitance ratio with respect to the other capacitors of the capacitor bank. For this reason, there is a tradeoff between the selected resolution of an SAR analog-digital converter, its chip size and its unit capacitance.

If the unit capacitance is very small, it is difficult to accurately define its capacitance with regard to the capacitors having capacitances larger by a factor of 2 to $2^{B-1}$. When selecting the lowest capacitance with an increased size that can be more accurately implemented, the capacitor with the highest capacitance consumes a large area when implemented in an integrated circuit, in particular at high resolutions.

Accordingly, an exemplary embodiment as further described below includes an analog-digital converter having a decision unit to evaluate a comparison potential in a decision step to obtain a comparison result; a number of charging units each comprising a switchable capacitor and an associated reference potential source, wherein each charging unit is configured to change the comparison potential by connecting the reference potential source to the switchable capacitor; a control unit to successively switch one of the charging units following a previous decision step, wherein depending on the obtained comparison result the comparison potential is changed by the one respective charging unit, wherein at least two of the charging units have an associated reference potential source providing different reference potentials.

According to an embodiment, it is a principle of an embodied analog-digital converter that after each decision step, in which the comparison potential is assessed with respect to a threshold, it is decided whether or not the comparison potential is changed by redistributing a predetermined charge, e.g., a comparison line to prepare its comparison potential for a following decision step. Conventionally, the charge to be redistributed on the comparison line is high for determining the most significant bits and progressively decreases as the conversion proceeds. The redistributed charge making up a change of the comparison potential is usually halved after each decision step, so that towards the determination of the least significant bit the respective redistributed charge becomes very low.

However, the amount of redistributed charge needs to be well-defined as it essentially determines the accuracy of the conversion. As outlined above, there may be difficulties for integrated designs of analog-digital converters in properly dimensioning low capacities on integrated circuits. To simply increase the capacitance of the capacitor with the lowest capacitance, however, would lead to a large-sized capacitor for the most significant bit.

To achieve a better accuracy of conversion without having large-sized capacitors in the integrated circuit, it is therefore proposed according to an embodiment to provide the predetermined charge to be redistributed on the comparison potential by using a combination of the capacitances of the respective capacitors and the reference potentials by which the capacitor charge level is shifted. In other words, while a first reference potential is applied to the capacitor after one or more of the first decision steps, a second reference potential that is lower than the first reference potential is applied to the one or more capacitors associated to one or more of the following decision steps. The capacitors being applied with the reduced second reference potential should preferably have an increased capacitance compared to a conventional SAR converter. It is preferred that the overall charge amount to be redistributed to the comparison potential is halved after each decision step. As a result, in particular for the capacitors related to the least significant bit determination, higher capacitances can be chosen while for switching a lower second reference potential is applied to keep the predetermined redistributed charges at a predetermined level. This can be achieved by ensuring that the product of voltage shift due to the application of the reference potential and the capacitance of each respective capacitor is halved from one decision step to the next.

Furthermore, at least two of the charging units may each have a switchable capacitor with the same capacitance.

According to an embodiment, the switchable capacitors of the at least two charging units may have the lowest capacitances among the switchable capacitors.

It may be provided that the associated reference potential sources of two of the at least two charging units differ by a factor of 2.

The capacitances of the switchable capacitor and the associated reference potential sources of two of the at least two charging units may be adapted to provide changes to the comparison potential which differ by a factor of 2.

According to an embodiment of a further aspect, a differential analog-digital converter includes a decision unit configured to evaluate a potential difference between two input signal lines in a decision step; a plurality of charging units for each input signal line each having a switched capacitor unit which is configured to change an input signal line potential on the respective input signal line on application of a reference voltage change; at least one further charging unit at each input signal line is configured to increase an input signal line potential on one input signal line on application of a first voltage change; at least another further charging unit for each input signal line is configured to decrease an input signal line potential on the respective other input signal line on application of a second voltage change, wherein the sum of the (absolute values of the) first and the second voltage changes equals the reference voltage change; a control unit configured to selectively switch one of the number of charging units at one of the input signal lines depending on a result of evaluating the potential difference between the two input signal lines in a previous decision step; and selectively switch the one further charging unit at one of the input signal lines and the other further charging units at the respective other input signal line depending on a result of evaluating the potential difference between the two input signal lines in a further previous decision step such that the input signal line potential of the one input signal line is increased and the input signal line potential of the other input signal line is reduced, wherein the one further charging unit is configured to increase an input signal line potential on the one input signal line on application of the first voltage change and the other further charging unit is configured to decrease an input signal line potential on the other input signal line on application of the second voltage change in the further decision step.

Moreover, at least one of the charging units, the at least one further charging unit and the at least one other further charging unit may have switched capacitor units having capacitors with the same capacitance.

It may be provided that the capacitors have the smallest capacitance among the capacitances of the switched capacitor units.

According to still another embodiment, a method is provided for operating an analog-digital converter including a number of charging units each comprising a switchable capacitor and an associated reference potential source. The method includes evaluating a comparison potential in successive decision steps to obtain a comparison result; successively switching one of the charging units following a previous one of the decision steps, wherein, depending on the obtained comparison result, the comparison potential is changed by the one respective charging unit by means of connecting the associated reference potential source to the switchable capacitor, wherein in two of the successive switching steps different reference potentials are applied to the switchable capacitors.

Referring now to FIG. 1, there is shown a schematic of a common non-differential SAR analog-digital converter 1 according to an embodiment. The analog-digital converter 1 has a topology generally known from conventional SAR converters.

The analog-digital converter 1 has a decision latch 2 which can be a conventional operational amplifier. The operational amplifier is configured to output an output signal the level of which indicates whether a potential on a comparison line 3 is positive or negative. The decision latch 2 has a non-inverting input which is connected to the comparison line 3 and an inverting input to which a ground potential $V_{GND}$ is applied. In the present case, it is assumed that the decision latch 2 outputs a signal low level, i.e., a logical "0", for a potential which is lower than a ground potential GND and a signal high level, i.e. a logical "1", in case the potential on the comparison line 3 is higher than the ground potential $V_{GND}$.

The comparison line 3 has an input switch 4, so that the comparison line 3 can be selectively connected to the ground potential $V_{GND}$. The input switch 4 serves for sampling the input signal.

Between the input switch 4 and the non-inverting input of the decision latch 2, a capacitor bank 5 having a number of capacitors is arranged. In the present embodiment, five capacitors, a first to fifth capacitor $6_1$-$6_5$, are shown. Since the number of capacitors corresponds to the resolution of the analog-digital converter 1, a 5-bit analog digital converter is shown.

For each of the capacitors $6_1$-$6_5$, a first end is connected to the comparison line 3 and a second end is connected to an associated capacitor switch 7, i.e., a first to fifth capacitor switch $7_1$ to $7_5$. The capacitors $6_1$-$6_5$ have capacitances $C_1$ to $C_5$, wherein $C_4$ and $C_5$ have an identical capacitance which is the smallest capacitance (unit capacitance C) of the capacitors $6_1$-$6_5$ of the capacitor bank 5. The capacitances $C_4$, $C_5$ can be predetermined. For each further capacitor $6_1$ to $6_3$, the capacitance $C_1$, $C_2$, $C_3$ doubles with respect to the next lower capacitance. In other words, $$C_x = 2^{4-x} \cdot C (\text{for } x=1 \text{ to } 3).$$

And in general $$C_x = 2^{m-1-x} \cdot C (\text{for } x=1 \text{ to } m-y),$$

wherein m corresponds to the number of capacitors and y to the number of capacitors having the same unit capacitance.

The capacitor switches $7_1$ to $7_5$ are each configured to connect the second end of the associated capacitor $6_1$ to $6_5$ to an input signal line 9 or to one of a first reference potential line 10 or second reference potential line 12 or to a ground potential line 11. The input switch 4 and the capacitor switches $7_1$ to $7_5$ can be provided using common CMOS transistors, such as NMOS or PMOS transistors or the like.

The first and second reference potential $V_{ref1}$, $V_{ref2}$ can be provided by a respective voltage source and can, e.g., be obtained by means of a voltage divider having two resistors. It is preferred that the second reference potential $V_{ref2}$ is obtained on the basis of the first reference potential $V_{ref1}$. For instance, a voltage divider with identical resistances which are connected in series and are coupled between the first reference potential $V_{ref1}$ and the ground potential $V_{GND}$ could be used. The obtained second reference potential $V_{ref2}$ does not need to be very precisely $(V_{ref1}-V_{GND})/2$, since only the least significant bit(s) is/are affected.

The output of the decision latch 2 is coupled to a shift register 13 in which the decision results are stored successively after each decision step. Furthermore, a control unit 14 is provided which controls the input switch 4 and the capacitor switches $7_1$ to $7_5$ according to a conversion scheme of a number of successive switching and determination steps corresponding to the number of capacitors $6_1$ to $6_5$ of the capacitor bank 5.

Each of the first to fourth capacitor switches $7_1$ to $7_4$ is capable of connecting the second end of the capacitor $C_o$ to the first reference potential line 10 carrying a first reference potential $V_{ref1}$. The fifth capacitor switch $7_5$ is capable of connecting the second end of the capacitor $6_5$ to the second reference potential line 12 carrying a second reference potential $V_{ref2}$ which is in the middle between the first reference potential and the ground potential GND. In other words, $$V_{ref2} = (V_{ref1} - V_{GND})/2 + V_{GND}.$$

The SAR analog-digital converter 1 can be operated as follows:

Sampling is done by connecting the second ends of the capacitors 6 to the input signal line 9 and by closing the input switch 4 to connect the comparison line 3 to the ground potential $V_{GND}$. The capacitors $6_1$ to $6_5$ of the capacitor bank 5 are charged depending on the voltage difference between the input signal potential $V_{in}$ on the input signal line 9 and the ground potential $V_{GND}$.

In a next step the input switch 4 is opened, so that the comparison line 3 becomes floating. Then the second to fifth capacitor switches $7_2$ to $7_5$ are all switched to connect the second ends of the capacitors $6_2$ to $6_5$ to the first or second reference potential lines 10, 12, respectively, to apply the first reference potential $V_{ref1}$ to the capacitors $6_2$ to $6_4$ and the second reference potential $V_{ref2}$ to the capacitor $6_5$.

While the capacitor $6_1$ having the highest capacitance remains connected to the ground potential $V_{GND}$, a decision step is carried out and the result of the decision step is stored into the shift register 13. The decision step is performed in the decision latch 2, wherein the comparison line potential is compared with the ground potential $V_{GND}$. The comparison result is a logical "1" if the comparison line potential is higher than the ground potential $V_{GND}$ and is a logical "0" if the comparison line potential is lower than the ground potential $V_{GND}$.

Depending on the comparison result obtained, it is decided whether the capacitor switch $7_1$ shall apply the first reference potential $V_{ref1}$ to the second end of the first capacitor $6_1$ by connecting the first reference potential line 10 to the second end of the respective capacitor $6_1$ or not. If it is found that the comparison line potential is lower than the ground potential $V_{GND}$ (comparison result of "0"), the first reference potential $V_{ref1}$ is applied to the second end of the first capacitor $6_1$ while, if it is determined that the comparison line potential is higher than the ground potential $V_{GND}$ (comparison result of "1"), the first capacitor switch $7_1$ remains in its set switching state, in which the second end of the respective capacitor is connected to the ground potential line 11 to apply the ground potential $V_{GND}$.

Then, the second capacitor switch $7_2$ connects the second end of the second capacitor $6_2$ to the first ground potential line 11 and a decision step is carried out. The result of the decision step at the output of the decision latch 2 is stored in a next cell of the shift register 13 and, depending on the recently received comparison result, the capacitor switch $7_2$ remains connected to a first reference potential line 10 or is reconnected to the ground potential line 11. This sequence of setting and decision steps is carried out until comparison results have been obtained after each setting step.

In contrast to the other first to fourth capacitor switches $7_1$ to $7_4$, the fifth capacitor connector $7_5$ connects the second end of the capacitor $6_5$ to the second reference potential line 12 to apply a second reference potential $V_{ref2}$, which is half of the first reference potential $V_{ref1}$ with respect to the ground potential $V_{GND}$. As the capacitance of the capacitor $6_5$ equals the capacitance $C_4$ of the capacitor $6_4$ and the voltage swap at the second end of the fifth capacitor $6_5$ is only half of the voltage swap of the capacitor $6_4$, the charge redistributed between the capacitors on the comparison line 3 is half compared to the charge redistributed between the capacitors on the comparison line 3 when switching the capacitor switch $7_4$.

As the fourth and fifth capacitors $6_4$ and $6_5$ have the same capacitance, it can be avoided to provide a capacitor having a capacitance of only half the capacitance of the capacitor $6_5$. This helps reducing the overall spread between the capacitances of the used capacitors from a ratio of $2^m$ to a ratio of $2^{m-1}$. This is advantageous in that the chip area requirement for the capacitors $6_1$ to $6_5$ of the capacitor bank 5 is substantially reduced. Also, accuracy issues when providing low capacitances with a predetermined ratio to another larger capacitance can be reduced.

By providing more than two reference potentials it is also possible to use more than two capacitors having the same capacitance, which is the lowest capacitance of the capacitors $6_1$ to $6_5$ of the capacitor bank 5. After each decision step the voltage change on the comparison line 3 by switching just one capacitor should be exactly half of the voltage change on the comparison line in the previous decision step. For instance, when three capacitors having identical capacitances are used in the above embodiment, the second end of the third capacitor $6_3$ can be applied with the first reference potential $V_{ref1}$, the fourth capacitor $6_4$ can be applied with the second reference potential $V_{ref2}$, which is half of the first reference potential $V_{ref1}$ with respect to the ground potential $V_{GND}$, and the fifth capacitor $6_5$ can be applied with a third reference potential $V_{ref3}$ which is a quarter of the first reference potential $V_{ref1}$ with respect to the ground potential $V_{GND}$.

Figure 2:
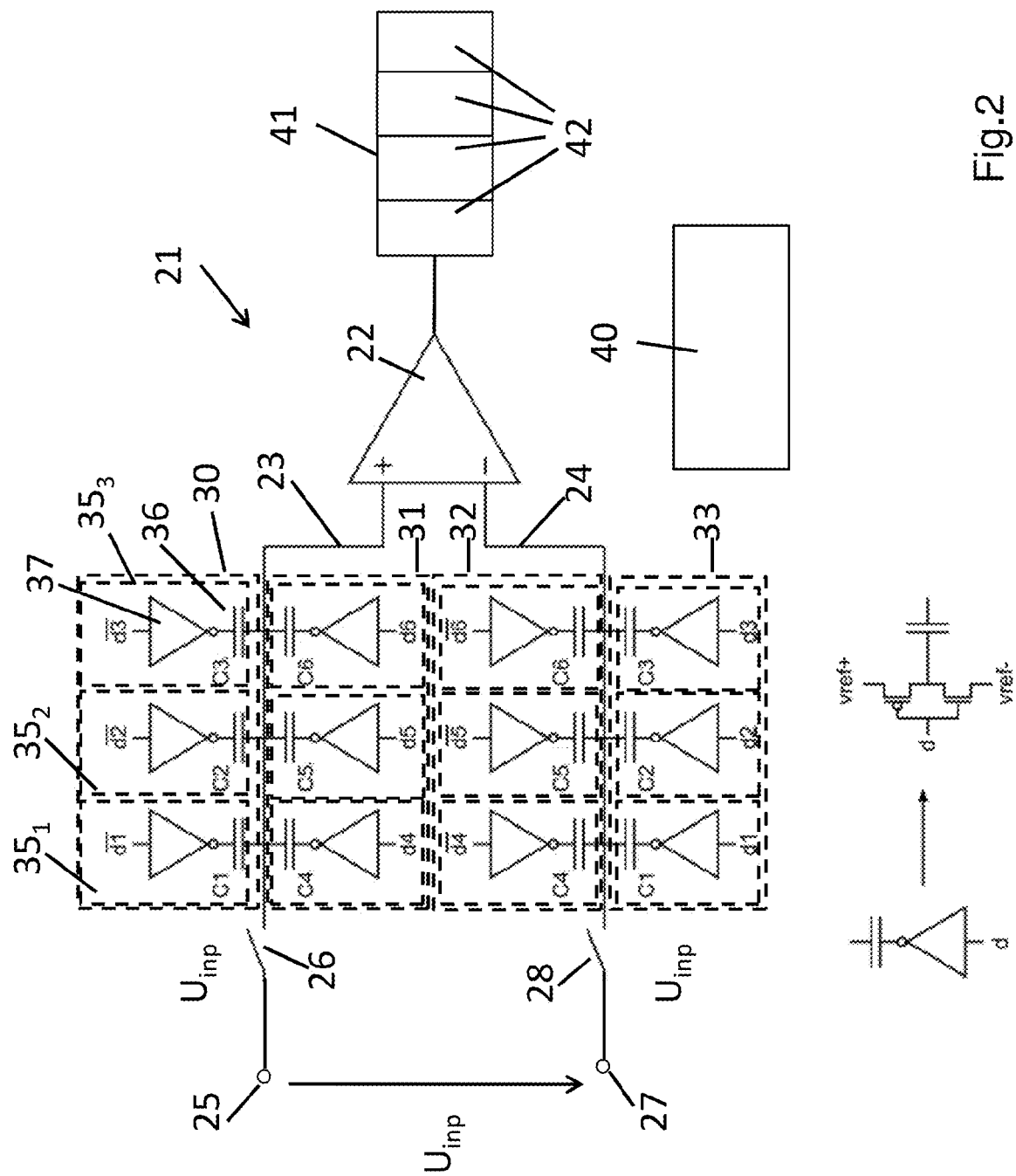
FIG. 2 shows a schematic of a differential analog-digital converter according to another embodiment.

FIG. 2 shows a schematic of differential analog-digital converter 21 according to another embodiment. The analog-digital converter 21 has a topology generally known from SAR converters. The analog-digital converter 21 has a decision latch 22 substantially of the same type as in embodiment of FIG. 1. The decision latch 22 can be a conventional operational amplifier. The operational amplifier is configured to output an output signal the level of which indicates whether a differential input voltage applied between a non-inverting input and an inverting input is positive or negative. In the present case it is assumed that the decision latch 2 outputs a signal low level, i.e. a logical "0" for a negative input voltage, and a signal high level, i.e. a logical "1" for a positive input voltage. The decision latch 22 serves for performing decision steps and provides a decision output.

The non-inverting input of the decision latch 22 is connected with a first input signal line 23 and the inverting input is connected with a second input signal line 24. The first input signal line 23 is connected to a first input terminal 25 via a first input switch 26 and the second input signal line 24 is connected to a second input terminal 27 via a second input switch 28. The first and second input terminals 25, 27 are for receiving a differential input signal $U_{inp}$ to be digitally converted by the analog-digital converter 21. The input switches 26, 28 can be common CMOS switches or the like.

The first input signal line 23 is connected to a first capacitor bank 30 and a second capacitor bank 31 and the second input signal line 24 is connected to a third capacitor bank 32 and a fourth capacitor bank 33. In other words, each input signal line 23, 24 is connected to two capacitor banks.

The capacitor banks 30, 31, 32, 33 in the embodiment of FIG. 2 each have three switched capacitor units $35_1, 35_2, 35_3$. Each switched capacitor unit $35_1, 35_2, 35_3$ has one capacitor 36 the first end of which is coupled to the respective signal line 23, 24 and the second end of which is coupled to an output of an inverter 37. The inverter 37 is capable of applying a first (lower) reference potential $V_{ref-}$ or a second (upper) reference potential $V_{ref+}$ to the second end of the capacitor 36, depending on one of control signal d1 to d6 applied at a respective inverter input. Each inverter 37 is a serially connected semiconductor switch preferably CMOS transistors the gates of which the respective control signal d1 to d6 is applied while the series connection, i.e., the source of the CMOS transistors, is coupled with the first reference potential $V_{ref-}$ and the second reference potential $V_{ref+}$. This allows to selective application one of the reference potentials $V_{ref+}$ and $V_{ref-}$ to the second end of the respective capacitor 36.

In the present embodiment, the number of capacitors of each capacitor bank 30, 31, 32, 33 is 3; however, the number of capacitors of the capacitor bank can differ and can be lower or higher than 3, depending on the required resolution of the analog-digital converter 21. Furthermore, it is preferred that the capacitor banks 30, 31, 32, 33 have the same number of capacitors; however, it is also possible to have at least one capacitor bank the number of whose capacitors 36 differs from the number of capacitors of the other capacitor banks.

In particular, the control signals d1 to d3 are for controlling the reference potential applied on the second ends of the capacitors 36 of the first capacitor bank 30 and the fourth capacitor bank 33. The control signals d4 to d6 are for controlling the reference potential applied on the second ends of the capacitors 36 of the second and the third capacitor bank 31, 32.

The three capacitors 36 of each of the capacitor banks 30, 31, 32, 33 have capacitances of 4C for the first switched capacitor unit $35_1$, 2C for the second switched capacitor unit $35_2$ and 2C for the third switched capacitor unit $35_3$ to provide a binary conversion. The first switched capacitor unit $35_1$ and the second switched capacitor unit $35_2$ are connectable with first reference potential $V_{ref-}$ and the second reference potential $V_{ref+}$ (thereby providing a reference voltage change when switching between the reference potentials). The third switched capacitor unit $35_3$ of the first and second capacitor banks 30, 31 at the first input signal line 23 are connectable with the second reference potential $V_{ref-}$ and a third reference potential $V_{ref3}$ (thereby providing a first voltage change) while the third switched capacitor unit $35_3$ of the first and second capacitor banks 32, 33 at the second input signal line 24 are connectable with the second reference potential $V_{ref+}$ and the third reference potential $V_{ref3}$ (thereby providing a second voltage change). The third reference potential $V_{ref3}$ is a potential substantially between the first reference potential $V_{ref-}$ and the second reference potential $V_{ref+}$.

The control signals d1 to d3 on the inverter inputs of the inverters 37 of the first capacitor bank 30 and the control signals d4 to d6 of the third capacitor bank 32 are inverted. In the present embodiment the control signals applied to the first capacitor bank 30 are inverted control signals /d1 to /d3 and the control signals applied to the fourth capacitor bank 33 are non-inverted control signals d1 to d3.

According to the inverter design, a low level (logical "0") of the non-inverted control signals d1 to d6 lead to the output of the second reference potential $V_{ref+}$ to the second end of the respective capacitor 36 and the high level of the control signals d1 to d6 results in applying the first reference potential $V_{ref-}$ to the second end of the respective capacitor 36. Analogously, the inverted control signals /d1 to /d6 lead to the output of the first reference potential $V_{ref-}$ to the second end of the respective capacitor 36 for a low level of d1 to d6 and the high level of the control signals d1 to d6 results in applying the second reference potential $V_{ref+}$ to the second end of the respective capacitor 36.

The control signals d1 to d6 are generated by means of a control unit 40. Further, the control unit 40 controls the first and second input switches 26, 28. The main task of the control unit is to control the conversion process in its timely sequence such that a comparison step and step of switching the switched capacitor units $35_1$, $35_2$, $35_3$ are consecutively carried out.

Furthermore, a register 41 is coupled having register cells 42 to store comparison outputs generated by the decision latch 22. The number of register cells 42 corresponds to the number of capacitors 36 in each of the capacitor banks 30, 31, 32, 33, i.e. four register cells 42 for three capacitors 36. The register 41 is also controlled by the control unit 40 to be operated as a shift register. In other words, the control unit 40 controls the register 41 so that the result of each comparison of a number of decision steps is successively stored into the register cells 42 of the register 41.

In general, the operation of the control unit 40 serves for providing control signals d1 to d6 that, depending on a previous result of a decision step performed by the decision latch 22, the loads of each input signal line 23, 24 is changed. This sequence is repeated for each capacitor 36 of each of the capacitor banks 30, 31, 32, 33, starting with the capacitor 36 in the first switched capacitor unit $35_1$ having the highest capacitance to the capacitor 36 in the second an third switched capacitor units $35_2$ and $35_3$ having the lowest capacitance in order of decreasing capacitances while storing the comparison outputs obtained in the decision latch 22 into a respective register cell 42 of the register 41 after each comparison step. As a general rule, the switching of the switched capacitor units 35 is carried out such that voltage difference between the charged input signal lines 23, 24 is reduced.

In contrast to the converter of FIG. 1, above topology of the differential SAR analog-digital converter 21 allows to supply a third reference potential with a reduced accuracy as long as the switching at the third switched capacitor units $35_3$ connected to the first input signal line 23 is between the first reference potential $V_{ref-}$ the third reference potential $V_{ref3}$ and as the third switched capacitor units $35_3$ connected to the second input signal line 24 is between the second reference potential, $V_{ref+}$ and the third reference potential $V_{ref3}$. In total, the absolute values of the switched potential differences at the first and second input lines 23, 24 (first voltage change and second voltage change, respectively) sum up to the voltage between the first and second reference potentials $V_{ref-}$, $V_{ref+}$.

Reference List
1 analog-digital converter
2 decision latch
3 comparison line
4 input switch
5 capacitor bank
$6_1$ to $6_5$ capacitors
$7_1$ to $7_5$ capacitor switch
9 input signal line
10 first reference potential line
11 ground potential line
12 second reference potential line
13 shift register
14 control unit
21 analog-digital converter
22 decision latch
23 first input signal line
24 second input signal line
25 first input terminal
26 first input switch
27 second input terminal
28 second input switch
30 first capacitor bank
31 second capacitor bank
32 third capacitor bank
33 fourth capacitor bank
35 switched capacitor unit
36 capacitor
37 semiconductor switch or inverter
40 control unit
41 register
42 register cell

The invention claimed is:

1. A method of operating a differential analog-digital converter, the method comprising:
configuring a decision unit to evaluate a potential difference between two input signal lines in a decision step;
configuring a plurality of charging units for each input signal line each having a switched capacitor unit which is configured to change an input signal line potential on the respective input signal line on application of a reference voltage change;
configuring at least one further charging unit at each input signal line to increase an input signal line potential on one input signal line on application of a first voltage change;
configuring at least another further charging unit for each input signal line to decrease an input signal line potential on the respective other input signal line on application of a second voltage change, wherein the sum of the first and the second voltage change equals the reference voltage change;
configuring a control unit to:
selectively switch one of the number of charging units at one of the input signal lines depending on a result of evaluating the potential difference between the two input signal lines in a previous decision step; and
selectively switch the one further charging unit at one of the input signal lines and the other further charging units at the respective other input signal line depending on a result of evaluating the potential difference between the two input signal lines in a further previous decision step such that the input signal line potential of the one input signal line is increased and the input signal line potential of the other input signal line is reduced;
wherein the one further charging unit is configured to increase an input signal line potential on the one input signal line on application of the first voltage change and the other further charging unit is configured to decrease an input signal line potential on the other input signal line on application of the second voltage change in the further decision step.

2. The method according to claim 1, wherein at least one of the charging units, the at least one further charging unit and the at least one other further charging unit have switched capacitor units having capacitors with the same capacitance.

3. The method according to claim 2, wherein the capacitors have the smallest capacitance among the capacitances of the switched capacitor units.

4. A differential analog-digital converter, comprising:
a decision unit configured to valuate a potential difference between two input signal lines in a decision step;
a plurality of charging units for each input signal line each having a switched capacitor unit which is configured to change an input signal line potential on the respective input signal line on application of a reference voltage change;
at least one further charging unit at each input signal line is configured to increase an input signal line potential on one input signal line on application of a first voltage change;
at least another further charging units for each input signal line is configured to decrease an input signal line potential on the respective other input signal line on application of a second voltage change, wherein the sum of the first and the second voltage change equals the reference voltage change;
a control unit configured to:
selectively switch one of the number of charging units at one of the input signal lines depending on a result of evaluating the potential difference between the two input signal lines in a previous decision step; and
selectively switch the one further charging unit at one of the input signal lines and the other further charging units at the respective other input signal line depending on a result of evaluating the potential difference between the two input signal lines in a further previous decision step such that the input signal line potential of the one input signal line is increased and the input signal line potential of the other input signal line is reduced;
wherein the one further charging unit is configured to increase an input signal line potential on the one input signal line on application of the first voltage change and the other further charging unit is configured to decrease an input signal line potential on the other input signal line on application of the second voltage change in the further decision step.

5. The differential analog-digital converter according to claim 4, wherein at least one of the charging units, the at least one further charging unit and the at least one other further charging unit have switched capacitor units having capacitors with the same capacitance.

6. The differential analog-digital converter according to claim 5, wherein the capacitors have the smallest capacitance among the capacitances of the switched capacitor units.

7. A method for operating a differential analog-digital converter, the method comprising:
evaluating, with a decision unit, a potential difference between two input signal lines in a decision step;
changing, with a plurality of charging units for each input signal line each having a switched capacitor unit, an input signal line potential on the respective input signal line on application of a reference voltage change;
increasing, with at least one further charging unit at each input signal line, an input signal line potential on one input signal line on application of a first voltage change;
decreasing, with at least another further charging unit for each input signal line, an input signal line potential on the respective other input signal line on application of a second voltage change, wherein the sum of the first and the second voltage change equals the reference voltage change;
selectively switching, with a control unit, one of the number of charging units at one of the input signal lines depending on a result of evaluating the potential difference between the two input signal lines in a previous decision step; and
selectively switching, with the control unit, the one further charging unit at one of the input signal lines and the other further charging units at the respective other input signal line depending on a result of evaluating the potential difference between the two input signal lines in a further previous decision step such that the input signal line potential of the one input signal line is increased and the input signal line potential of the other input signal line is reduced;
wherein the one further charging unit is configured to increase an input signal line potential on the one input signal line on application of the first voltage change and the other further charging unit is configured to decrease an input signal line potential on the other input signal line on application of the second voltage change in the further decision step.

8. The method according to claim 7, wherein at least one of the charging units, the at least one further charging unit and the at least one other further charging unit have switched capacitor units having capacitors with the same capacitance.

9. The method according to claim 8, wherein the capacitors have the smallest capacitance among the capacitances of the switched capacitor units.

* * * * *